(12) United States Patent
Marzano

(10) Patent No.: US 10,838,064 B2
(45) Date of Patent: Nov. 17, 2020

(54) OPTICAL SENSING, NON-TETHERED LOCATION MONITORING SYSTEMS AND METHODS OF USE

(71) Applicant: Velocity Magnetics, Inc., New Castle, PA (US)

(72) Inventor: Domenic P. Marzano, New Castle, PA (US)

(73) Assignee: Velocity Magnetics, Inc., New Castle, PA (US)

(*) Notice: Subject to any disclaimer, the term of this patent is extended or adjusted under 35 U.S.C. 154(b) by 0 days.

(21) Appl. No.: 16/645,021

(22) PCT Filed: Sep. 10, 2018

(86) PCT No.: PCT/US2018/050259
§ 371 (c)(1),
(2) Date: Mar. 6, 2020

(87) PCT Pub. No.: WO2019/051409
PCT Pub. Date: Mar. 14, 2019

(65) Prior Publication Data
US 2020/0209396 A1    Jul. 2, 2020

Related U.S. Application Data

(60) Provisional application No. 62/555,967, filed on Sep. 8, 2017.

(51) Int. Cl.
*G01S 17/00* (2020.01)
*G01S 17/46* (2006.01)
*G01R 33/07* (2006.01)
*G01S 17/88* (2006.01)

(52) U.S. Cl.
CPC ............ *G01S 17/46* (2013.01); *G01R 33/075* (2013.01); *G01S 17/88* (2013.01)

(58) Field of Classification Search
USPC ....................................................... 356/4.01
See application file for complete search history.

(56) References Cited

U.S. PATENT DOCUMENTS

| | | | |
|---|---|---|---|
| 4,915,500 A | 4/1990 | Selkowitz | |
| 5,114,227 A * | 5/1992 | Cleveland, Jr. | G01S 3/781 356/139.05 |
| 5,208,496 A | 5/1993 | Tozoni et al. | |
| 5,345,304 A * | 9/1994 | Allen | G01S 7/4802 356/5.01 |

(Continued)

*Primary Examiner* — James R Hulka
(74) *Attorney, Agent, or Firm* — The Webb Law Firm

(57) ABSTRACT

Provided is a system for optical sensing. The system may include a linear motor, which may include a first member and a second member. The second member may be movable relative to the first member. At least one optical sensor may be disposed with the first member. A target may be disposed with the second member. The target may include at least one pattern of alternating first areas and second areas. The first areas may include a first color. The second areas may include a second color different than the first areas. The target may be positioned to overlap with an optical path of the at least one optical sensor as the second member moves relative to the first member. A method for optical sensing and a method for making a system for optical sensing are also disclosed.

23 Claims, 8 Drawing Sheets

(56) References Cited

U.S. PATENT DOCUMENTS

| | | | | |
|---|---|---|---|---|
| 5,402,401 | A | * | 3/1995 | Akkermans .......... G11B 5/5556 369/30.17 |
| 5,779,241 | A | | 7/1998 | D'Costa et al. |
| 5,841,250 | A | * | 11/1998 | Korenage .......... G03F 7/70358 318/135 |
| 6,163,372 | A | | 12/2000 | Sallee et al. |
| 6,665,063 | B2 | * | 12/2003 | Jamieson ............. G01C 23/005 356/141.1 |
| 6,943,873 | B2 | * | 9/2005 | Sallee ................... F41G 7/2246 356/141.1 |
| 7,575,190 | B2 | * | 8/2009 | Sallee ................... F41G 7/2246 244/3.1 |
| RE41,769 | E | * | 9/2010 | Richards ................ F41G 7/226 244/3.16 |
| 10,050,507 | B2 | * | 8/2018 | Hofstetter .............. H02K 41/02 |
| 2008/0265826 | A1 | * | 10/2008 | Sasaki ................. G01D 5/2457 318/687 |
| 2015/0028699 | A1 | | 1/2015 | Hofstetter et al. |

\* cited by examiner

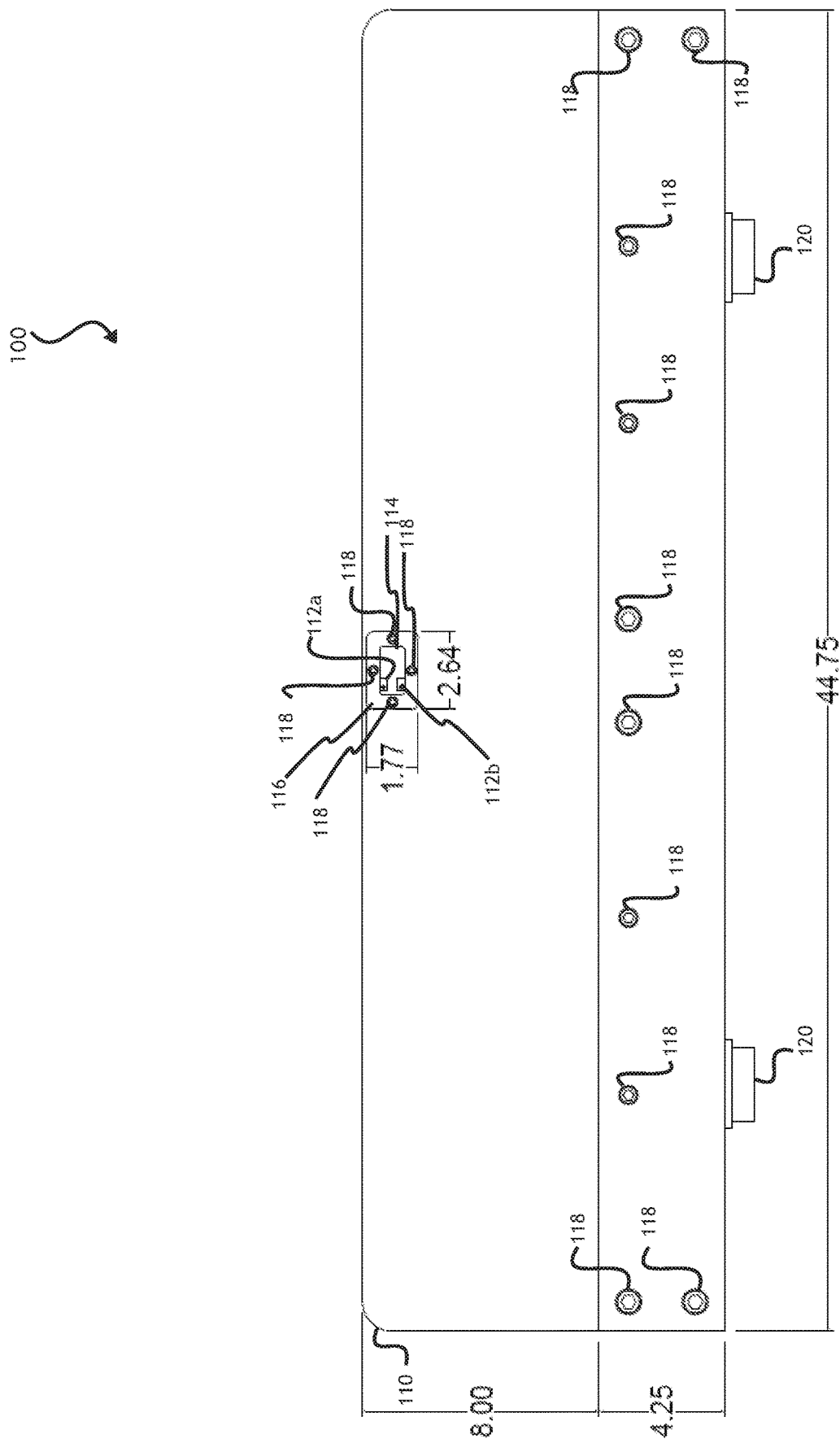

OPTICAL SENSING, NON-TETHERED LOCATION MONITORING SYSTEMS AND METHODS OF USE

CROSS-REFERENCE TO RELATED APPLICATIONS

This application is the United States national phase of International Application No. PCT/US2018/050259 filed Sep. 10, 2018, and claims priority to U.S. Provisional Patent Application No. 62/555,967 filed Sep. 8, 2017, the disclosures of which are hereby incorporated herein by reference in their entireties.

BACKGROUND

1. Field

This disclosed subject matter relates generally to systems and methods for optical sensing and, in some particular embodiments, to systems and methods for location monitoring using optical sensing.

2. Technical Considerations

In certain situations, it may be desirable to determine a precise position of a conveyance (e.g., a vehicle, a carrier, and/or the like). For example, the conveyance may be on a track along which the conveyance may be moved. Additionally or alternatively, the conveyance may not be confined to a track and/or may be capable of movement independent of a track. For example, such a conveyance may be controlled to move around a confined space, such as a hallway, warehouse, manufacturing facility, and/or the like. Certain systems may use electrical contact and/or attached cables to monitor the location of a conveyance. For example, an incremental rotary encoder wheel may be mounted to the conveyance and attached to monitoring electronics via cable(s). However, such implementations may limit the distance that the conveyance can travel, e.g., based on length of the cable(s) used by the system. Additionally, as the length of the cables increases, cable management may become challenging. For example, cable weight can increase with cable length and placement of the cables to avoid snags and damage can be challenging.

Alternatively, certain systems may use Hall effect sensors to determine position of the conveyance. For example, multiple (e.g., three) Hall effect sensors may be placed adjacent to a track on which the conveyance may move. Additionally, the conveyance may include magnets (e.g., permanent magnets, electromagnets, and/or the like). As such, each Hall effect sensor may produce a signal (e.g., output voltage) in response to a magnetic field, e.g., from the magnets of the conveyance moving past and/or being positioned proximate to the respective Hall effect sensor. However, Hall effect sensors may be relatively large and require a relatively large amount of spacing between adjacent sensors compared to a desired resolution of the position to be determined. For example, such Hall effect sensors may be several millimeters (mm) across and may be spaced over 70 mm (about 3 inches (in.)) apart. As such, the achievable resolution may be over 35 mm (about 1.5 in.).

SUMMARY

Accordingly, it is an object of the presently disclosed subject matter to provide systems and methods for optical sensing, e.g., location monitoring using optical sensing.

According to non-limiting embodiments, provided is a system for optical sensing. In some non-limiting embodiments, a system for optical sensing may include a linear motor, which may include a first member and a second member movable relative to the first member. At least one optical sensor may be disposed with the first member. A target may be disposed with the second member. The target may include at least one pattern of alternating first areas and second areas. The first areas may include a first color, and the second areas may include a second color different than the first areas. The target may be positioned to overlap with an optical path of the at least one optical sensor as the second member moves relative to the first member.

In some non-limiting embodiments, the first member may be attached to at least a portion of a track, and the second member is attached to a conveyance. In some non-limiting embodiments, the second member may include a linear permanent magnet carrier, and the first member may include a stator. Additionally or alternatively, the linear permanent magnet carrier may include at least two permanent magnets arranged in alternating polarity, and the stator may include stator coils. In some non-limiting embodiments, the second member may include a stator, and the first member may include a linear permanent magnet carrier.

In some non-limiting embodiments, the second member may be separated from the first member by an air gap. Additionally or alternatively, the target and the optical sensor(s) may face the air gap. Additionally or alternatively, the first member may define a first recess to at least partially receive the optical sensor(s). Additionally or alternatively, the second member may define a second recess to at least partially receive the target. Additionally or alternatively, the optical sensor(s) and the target do not entirely protrude into the air gap when received in the first recess and second recess, respectively.

In some non-limiting embodiments, the optical sensor(s) may include a first optical sensor and a second optical sensor. Additionally or alternatively, the pattern(s) may include a first pattern and a second pattern. Additionally or alternatively, the first pattern may be positioned to overlap with the optical path of the first optical sensor as the second member moves relative to the first member, and the second pattern may be positioned to overlap with the optical path of the second optical sensor as the second member moves relative to the first member. In some non-limiting embodiments, the first pattern may be offset from the second pattern in a direction of motion of the second member relative to the first member. In some non-limiting embodiments, the first optical sensor may produce a first output signal in response to sensing the first pattern of the target. Additionally or alternatively, the second optical sensor may produce a second output signal in response to sensing the second pattern of the target.

In some non-limiting embodiments, the target may include a mask, which may include the second color. Additionally or alternatively, the mask may be affixed on a portion of the second member. Additionally or alternatively, the mask may define a plurality of holes corresponding to the first areas. Additionally or alternatively, the portion of the second member may include the first color.

In some non-limiting embodiments, the optical sensor(s) may include at least one light emitting sensor. In some non-limiting embodiments, the light emitting sensor(s) may include a laser and an optical receiver. In some non-limiting embodiments, the light emitting sensor(s) may include a fiber optic transmitter and a fiber optic receiver. For example, the fiber optic transmitter may include a first optical fiber coupled to a light emitting diode (LED). Additionally or alternatively, the fiber optic receiver may include a second optical fiber coupled to an optical receiver. In some non-limiting embodiments, the first optical fiber and the second optical fiber may be coaxial.

In some non-limiting embodiments, at least one amplifier may be coupled to the optical sensor(s). Additionally or alternatively, each amplifier may amplify an output signal of a respective one of the at least one optical sensor. In some non-limiting embodiments, a controller may be coupled to the amplifier(s). Additionally or alternatively, the controller may receive the output signal of each optical sensor (e.g., as amplified by the amplifier(s)). Additionally or alternatively, the controller may determine at least one of a position or a velocity of the second member relative to the first member based on the output signal of each optical sensor.

In some non-limiting embodiments, the controller may control the linear motor based on the position and/or velocity.

According to non-limiting embodiments, provided is a method for optical sensing. In some non-limiting embodiments, a method for optical sensing may include sensing, with at least one optical sensor disposed with a first member of a linear motor, a target, the target disposed with a second member of the linear motor. The second member may be movable relative to the first member. The target may include at least one pattern of alternating first areas and second areas. The first areas may include a first color. The second areas may include a second color different than the first areas. The target may be positioned to overlap with an optical path of the optical sensor(s) as the second member moves relative to the first member. Additionally or alternatively, each optical sensor may generate an output signal based on sensing the target. Additionally or alternatively, a controller coupled to the optical sensor(s) may determine at least one of a position or a velocity of the second member relative to the first member based on the output signal of each optical sensor.

In some non-limiting embodiments, the linear motor may be controlled (e.g., by the controller) based on the position and/or velocity.

According to non-limiting embodiments, provided is a method for making a system for optical sensing. In some non-limiting embodiments, a method for making a system for optical sensing may include disposing at least one optical sensor with a first member of a linear motor. A target may be disposed with a second member of the linear motor. The second member may be movable relative to the first member. The target may include at least one pattern of alternating first areas and second areas. The first areas may include a first color. The second areas may include a second color different than the first areas. The target may be positioned to overlap with an optical path of the optical sensor(s) as the second member moves relative to the first member.

In some non-limiting embodiments, the first member may include a stator, and/or the second member may include a linear permanent magnet carrier. In some non-limiting embodiments, the second member may be separated from the first member by an air gap. Additionally or alternatively, the target and the optical sensor(s) may face the air gap. In some non-limiting embodiments, a first recess may be formed in the first member of the linear motor to at least partially receive the optical sensor(s). Additionally or alternatively, a second recess may be formed in the second member of the linear motor to at least partially receive the target. Additionally or alternatively, the optical sensor(s) and the target do not entirely protrude into the air gap when received in the first recess and second recess, respectively.

In some non-limiting embodiments, the optical sensor(s) may include a first optical sensor and a second optical sensor. Additionally or alternatively, the pattern(s) may include a first pattern and a second pattern. In some non-limiting embodiments, the first pattern may be positioned to overlap with the optical path of the first optical sensor as the second member moves relative to the first member. Additionally or alternatively, the second pattern may be positioned to overlap with the optical path of the second optical sensor as the second member moves relative to the first member. In some non-limiting embodiments, the first pattern may be offset from the second pattern in a direction of motion of the second member relative to the first member.

In some non-limiting embodiments, the target may include a mask, which may include the second color. Additionally or alternatively, the mask may be affixed on a portion of the second member. Additionally or alternatively, the mask may define a plurality of holes corresponding to the first areas. Additionally or alternatively, the portion of the second member may include the first color.

In some non-limiting embodiments, at least one amplifier may be coupled to the optical sensor(s). Each amplifier may amplify an output signal of a respective one of the optical sensor(s). Additionally or alternatively, a controller may be coupled to the amplifier(s) (or directly to the optical sensor(s)). In some non-limiting embodiments, the controller may receive the output signal of each optical sensor (e.g., as amplified by the amplifier(s)). Additionally or alternatively, the controller may determine at least one of a position or a velocity of the second member relative to the first member based on the output signal of each optical sensor.

Further embodiments are set forth in the following numbered clauses:

Clause 1: A system for optical sensing, comprising: a linear motor comprising a first member and a second member movable relative to the first member; at least one optical sensor disposed with the first member; and a target disposed with the second member, the target comprising at least one pattern of alternating first areas and second areas, the first areas comprising a first color, the second areas comprising a second color different than the first areas, the target positioned to overlap with an optical path of the at least one optical sensor as the second member moves relative to the first member.

Clause 2: The system of clause 1, wherein the first member is attached to at least a portion of a track, and wherein the second member is attached to a conveyance.

Clause 3: The system of clauses 1 or 2, wherein the second member comprises a linear permanent magnet carrier, and wherein the first member comprises a stator.

Clause 4: The system of any preceding clause, wherein the linear permanent magnet carrier comprises at least two permanent magnets arranged in alternating polarity, and wherein the stator comprises stator coils.

Clause 5: The system of any preceding clause, wherein the second member comprises a stator, and wherein the first member comprises a linear permanent magnet carrier.

Clause 6: The system of any preceding clause, wherein the second member is separated from the first member by an air gap, wherein the target and the at least one optical sensor face the air gap, wherein the first member defines a first recess to at least partially receive the at least one optical sensor, wherein the second member defines a second recess to at least partially receive the target, and wherein the at least one optical sensor and the target do not entirely protrude into the air gap when received in the first recess and the second recess, respectively.

Clause 7: The system of any preceding clause, wherein the at least one optical sensor comprises a first optical sensor and a second optical sensor, and wherein the at least one pattern comprises a first pattern and a second pattern, the first pattern positioned to overlap with the optical path of the first optical sensor as the second member moves relative to the first member, and the second pattern positioned to overlap with the optical path of the second optical sensor as the second member moves relative to the first member.

Clause 8: The system of any preceding clause, wherein the first pattern is offset from the second pattern in a direction of motion of the second member relative to the first member.

Clause 9: The system of any preceding clause, wherein the target comprises a mask comprising the second color, the mask affixed on a portion of the second member, the mask defining a plurality of holes corresponding to the first areas, wherein the portion of the second member comprises the first color.

Clause 10: The system of any preceding clause, wherein the at least one optical sensor comprises at least one light emitting sensor.

Clause 11: The system of any preceding clause, wherein the at least one light emitting sensor comprises a laser and an optical receiver.

Clause 12: The system of any preceding clause, wherein the at least one light emitting sensor comprises a fiber optic transmitter and a fiber optic receiver.

Clause 13: The system of any preceding clause, wherein the fiber optic transmitter comprises a first optical fiber coupled to a light emitting diode (LED), and wherein the fiber optic receiver comprises a second optical fiber coupled to an optical receiver.

Clause 14: The system of any preceding clause, wherein the first optical fiber and the second optical fiber are coaxial.

Clause 15: The system of any preceding clause, further comprising at least one amplifier coupled to the at least one optical sensor, each amplifier configured to amplify an output signal of a respective one of the least one optical sensor.

Clause 16: The system of any preceding clause, further comprising a controller coupled to the at least one amplifier, the controller configured to receive the output signal of each optical sensor as amplified by the at least one amplifier, the controller configured to determine at least one of a position or a velocity of the second member relative to the first member based on the output signal of each optical sensor.

Clause 17: The system of any preceding clause, wherein the at least one optical sensor comprises a first optical sensor and a second optical sensor, wherein the at least one pattern comprises a first pattern and a second pattern, the first pattern positioned to overlap with the optical path of the first optical sensor as the second member moves relative to the first member, and the second pattern positioned to overlap with the optical path of the second optical sensor as the second member moves relative to the first member, wherein the first optical sensor produces a first output signal in response to sensing the first pattern of the target, wherein the second optical sensor produces a second output signal in response to sensing the second pattern of the target.

Clause 18: The system of any preceding clause, wherein the controller is further configured to control the linear motor based on the at least one of the position or velocity.

Clause 19: A method for optical sensing, comprising: sensing, with at least one optical sensor disposed with a first member of a linear motor, a target, the target disposed with a second member of the linear motor, the second member movable relative to the first member, the target comprising at least one pattern of alternating first areas and second areas, the first areas comprising a first color, the second areas comprising a second color different than the first areas, the target positioned to overlap with an optical path of the at least one optical sensor as the second member moves relative to the first member; generating, with each optical sensor, an output signal based on sensing the target; and determining, with a controller coupled to the at least one optical sensor, at least one of a position or a velocity of the second member relative to the first member based on the output signal of each optical sensor.

Clause 20: The method of clause 19, further comprising controlling the linear motor based on the at least one of the position or velocity.

Clause 21: A method of making a system for optical sensing, comprising: disposing at least one optical sensor with a first member of a linear motor; and disposing a target with a second member of the linear motor, the second member movable relative to the first member, the target comprising at least one pattern of alternating first areas and second areas, the first areas comprising a first color, the second areas comprising a second color different than the first areas, the target positioned to overlap with an optical path of the at least one optical sensor as the second member moves relative to the first member.

Clause 22: The method of clause 21, wherein the first member comprises a stator, and the second member comprises a linear permanent magnet carrier.

Clause 23: The method of clause 21 or 22, wherein the second member is separated from the first member by an air gap, wherein the target and the at least one optical sensor face the air gap, wherein disposing the at least one optical sensor with the first member comprises forming, in the first member of the linear motor, a first recess to at least partially receive the at least one optical sensor, wherein disposing the target with the second member comprises forming, in the second member of the linear motor, a second recess to at least partially receive the target, and wherein the at least one optical sensor and the target do not entirely protrude into the air gap when received in the first recess and second recess, respectively.

Clause 24: The method of any one of clauses 21-23, wherein the at least one optical sensor comprises a first optical sensor and a second optical sensor, wherein the at least one pattern comprises a first pattern and a second pattern, the first pattern positioned to overlap with the optical path of the first optical sensor as the second member moves relative to the first member, and the second pattern positioned to overlap with the optical path of the second optical sensor as the second member moves relative to the first member, and wherein the first pattern is offset from the second pattern in a direction of motion of the second member relative to the first member.

Clause 25: The method of any one of clauses 21-24: wherein the target comprises a mask comprising the second color, the mask defining a plurality of holes corresponding to the first areas, wherein a portion of the second member comprises the first color, and wherein disposing the target with the second member comprises affixing the mask on the portion of the second member.

Clause 26: The method of any one of clauses 21-25, further comprising: coupling at least one amplifier to the at least one optical sensor, each amplifier configured to amplify an output signal of a respective one of the least one optical sensor; and coupling a controller to the at least one amplifier, the controller configured to receive the output signal of each optical sensor as amplified by the at least one amplifier, the controller configured to determine at least one of a position or a velocity of the second member relative to the first member based on the output signal of each optical sensor.

These and other features and characteristics of the presently disclosed subject matter, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosed subject matter. As used in the specification and the claims, the singular form of "a," "an," and "the" include plural referents unless the context clearly dictates otherwise.

BRIEF DESCRIPTION OF THE DRAWINGS

Additional advantages and details of the disclosed subject matter are explained in greater detail below with reference to the exemplary embodiments that are illustrated in the accompanying figures, in which:

FIG. 2A is a diagram of a side view of a non-limiting embodiment of a portion of the system of FIG. 1A according to the principles of the presently disclosed subject matter;

DESCRIPTION

Figure 1A:
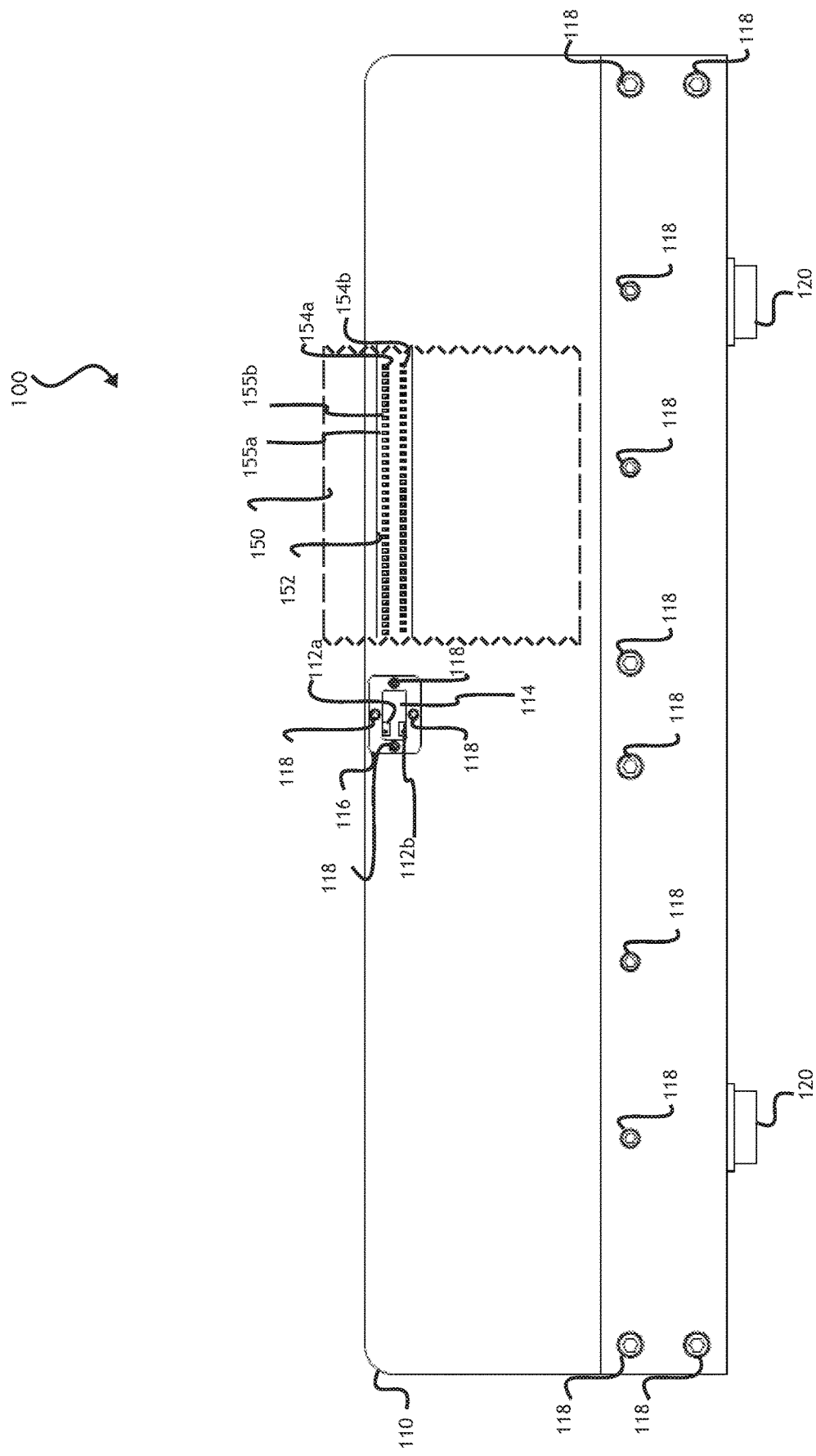
FIG. 1A is a diagram of a side view of a non-limiting embodiment of a system for optical sensing according to the principles of the presently disclosed subject matter.

For purposes of the description hereinafter, the terms "end," "upper," "lower," "right," "left," "vertical," "horizontal," "top," "bottom," "lateral," "longitudinal," and derivatives thereof shall relate to the disclosed subject matter as it is oriented in the drawing figures. However, it is to be understood that the disclosed subject matter may assume various alternative variations and step sequences, except where expressly specified to the contrary. It is also to be understood that the specific devices and processes illustrated in the attached drawings, and described in the following specification, are simply exemplary embodiments or aspects of the disclosed subject matter. Hence, specific dimensions and other physical characteristics related to the embodiments or aspects disclosed herein are not to be considered as limiting unless otherwise indicated.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise.

Non-limiting embodiments of the disclosed subject matter are directed to systems and methods for optical sensing, including, but not limited to, optical sensing of position, velocity, and/or the like. For example, non-limiting embodiments of the disclosed subject matter provide at least one optical sensor disposed with a first member of a linear motor and a target disposed with a second member of the linear motor movable relative to the first member. Such embodiments provide techniques and systems for precise determination of position, velocity, and/or the like with improved resolution, e.g., compared to magnetic sensors, such as Hall effect sensors. For example, depending on the configuration of the target, resolution may be made less than 0.02 inches (e.g., 0.0156 inches). Additionally or alternatively, such embodiments provide techniques and systems for precise determination of position, velocity, and/or the like without the need to tether cables to or electrically connect the moving member (e.g., second member) of the linear motor, thereby improving range and freedom of motion of such member (and/or a conveyance to which such member is attached). Additionally or alternatively, such embodiments provide techniques and systems for controlling the linear motor (e.g., motion of one of the members thereof) based on the sensed position, velocity, and/or the like. For example, in a warehouse and/or manufacturing facility, multiple conveyances (e.g., vehicles, carriers, carriages, harnesses, and/or the like) may be on one track (or separate but interconnected tracks), and each conveyance may be moved independently based on the sensed position, velocity, and/or the like of such conveyance. Compared to a chain-driven system where all conveyances are connected to a chain that moves all such conveyances at the same pace (e.g., the pace of the slowest portion, manufacturing cell, and/or the like along the track), such independent motion of conveyances may provide flexibility, increased speed at certain portions of the track, the ability to have separate paths (e.g., portions of the track) in parallel, and/or the like. Additionally or alternatively, such embodiments provide techniques and systems that may be used with a wide variety of conveyances. For example, such techniques and systems may be used in the amusement ride industry (e.g., for roller coasters and/or the like) and may allow for relatively precise, real-time determination of the position, velocity, and/or the like of such amusement rides. Additionally or alternatively, such techniques and systems may be used for transportation (e.g., commuter trains, cargo trains, people movers, automobiles, and/or the like), automotive industries (e.g., destructive testing and/or the like), defense industries, warehousing/inventory management, manufacturing industries (e.g., moving conveyances carrying workpieces to different portions of an assembly line, manufacturing cell(s), and/or the like), any industry suitable for moving conveyances (e.g., vehicles, carriers, carriages, harnesses, and/or the like) with precise sensing/measurement of position/velocity, and/or the like.

For the purpose of illustration, in the following description, while the presently disclosed subject matter is described with respect to systems and methods for optical sensing, e.g., of the position of a vehicle relative to a track, one skilled in the art will recognize that the disclosed subject matter is not limited to the illustrative embodiments. For example, the systems and methods described herein may be used with a wide variety of settings, such as optical sensing and/or position monitoring in any setting suitable for using such features, e.g., a conveyance (e.g., vehicle, carrier, carriage, harness, and/or the like) independent of a track and/or in a confined space, a warehouse, a manufacturing facility, and/or the like.

Referring now to FIGS. 1A-2B, FIGS. 1A-2B are diagrams of a non-limiting embodiment of a system for optical sensing. As shown in FIGS. 1A-2B, system 100 may include a linear motor having a first member (e.g., stator 110, a stationary surface or object, and/or the like) and a second member (e.g., linear permanent magnet carrier 150, a conveyance, and/or the like). In some non-limiting embodiments, the second member (e.g., linear permanent magnet carrier 150, a conveyance, and/or the like) may be movable relative to the first member (e.g., stator 110, a stationary surface or object, and/or the like). In some non-limiting embodiments, at least one optical sensor (e.g., optical sensors 112a, 112b) may be disposed with at least one of the members. For example, the optical sensor(s) 112a, 112b (or at least some of multiple optical sensors 112a, 112b) may be disposed with the first member (e.g., stator 110, a stationary surface or object, and/or the like). Additionally or alternatively, the optical sensor(s) 112a, 112b (or at least some of multiple optical sensors 112a, 112b) may be disposed with the second member (e.g., linear permanent magnet carrier 150, a conveyance, and/or the like). In some non-limiting embodiments, at least one target 152 may be disposed with at least one of the members. For example, the target(s) 152 (or at least some of multiple targets 152) may be disposed with the second member (e.g., linear permanent magnet carrier 150, a conveyance, and/or the like). Additionally or alternatively, at the target(s) 152 (or at least some of multiple targets 152) may be disposed with the first member (e.g., stator 110, a stationary surface or object, and/or the like).

In some non-limiting embodiments, the target 152 may include at least one pattern (e.g., patterns 154a, 154b). For example, the pattern(s) 154a, 154b may include alternating first areas 155a and second areas 155b. In some non-limiting embodiments, the first areas 155a may include a first color (e.g., black). Additionally or alternatively, the second areas 155b may include a second color (e.g., white) different than the first areas. For example, the colors of first areas 155a and second areas 155b may be selected to have a desirable amount of contrast (e.g., reflect different amounts of incident light). In some non-limiting embodiments, the target 152 may be positioned to overlap with an optical path of the optical sensor(s) 112a, 112b as the second member (e.g., linear permanent magnet carrier 150, a conveyance, and/or the like) moves relative to the first member (e.g., stator 110, a stationary surface or object, and/or the like).

Figure 1B:
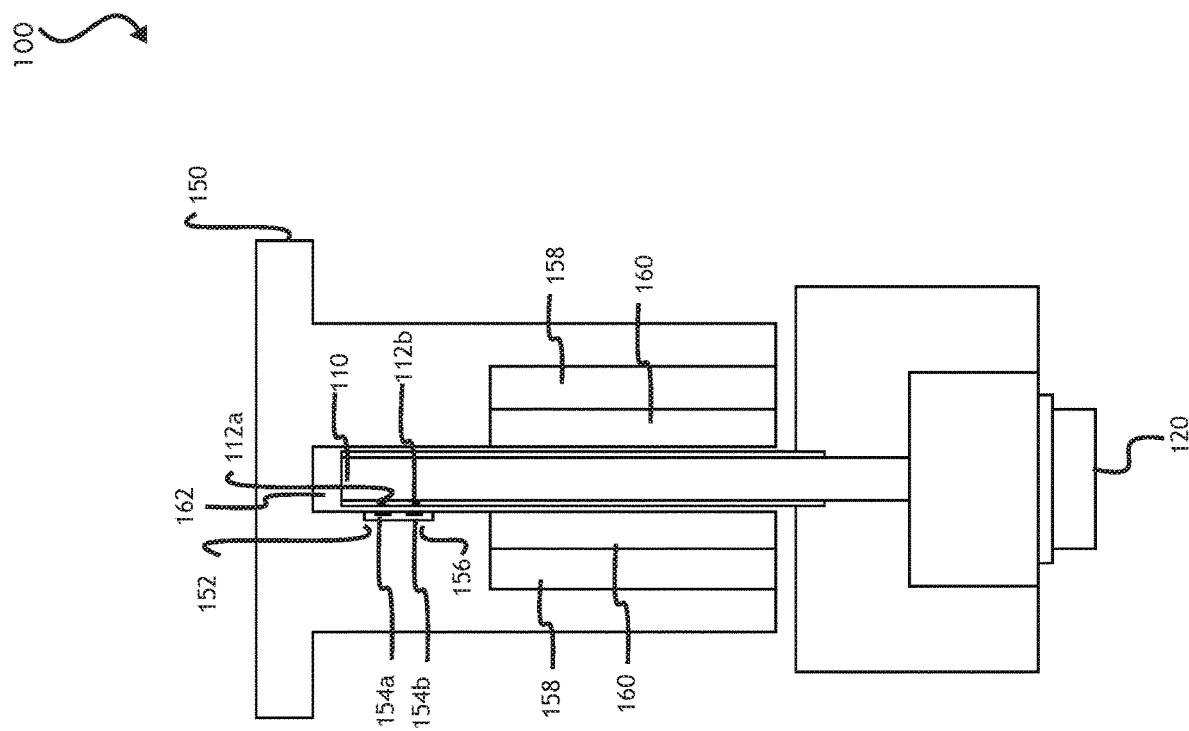
FIG. 1B is a diagram of a side view of a non-limiting embodiment of the system of FIG. 1A according to the principles of the presently disclosed subject matter.

In some non-limiting embodiments, the linear motor may be (or include) a linear synchronous motor (LSM), a linear induction motor (LIM), and/or the like. In some non-limiting embodiments, the linear motor may be the same as or similar to the linear motors described in U.S. Pat. No. 6,930,413, filed May 23, 2003, and issued Aug. 16, 2005, U.S. Pat. No. 8,727,078, filed Feb. 16, 2005, and issued May 20, 2014, and U.S. Pat. No. 10,046,644, filed Oct. 2, 2014, and issued Aug. 14, 2018, which are hereby incorporated by reference herein in their entirety. Additionally or alternatively, the linear motor may include at least one stator 110 and at least one linear permanent magnet carrier 150. (For the purpose of clarity and illustration, and not limitation, linear permanent magnet carrier 150 is depicted as transparent in FIG. 1A, except for target 152. However, linear permanent magnet carrier 150 may be solid and/or opaque, e.g., as depicted in FIG. 1B). In some non-limiting embodiments, linear permanent magnet carrier(s) 150 may be the same as or similar to a rotor of a round/cylindrical electric motor, except that linear permanent magnet carrier 150 may be arranged (e.g., the permanent magnets may be arranged) linearly rather than circularly/annularly. In some non-limiting embodiments, linear permanent magnet carrier(s) 150 may be attached to one or more conveyances (e.g., vehicles, carriers, carriages, harnesses, and/or the like). Additionally or alternatively, the stator(s) 110 may be attached to one or more tracks, one or more portions of a track, and/or the like. For example, stator 110 may be attached to the portion(s) of the track using any suitable number of fastener(s) 118. Additionally or alternatively, the components, parts, pieces, and/or the like of stator 110 may be combined, secured together, and/or the like using any suitable number of fastener(s) 118. In some non-limiting embodiments, fastener(s) 118 may be any suitable fastener, including but not limited to, one or more bolts, nuts, screws, nails, clips, and/or the like. In some non-limiting embodiments, linear permanent magnet carrier 150 may include at least two permanent magnets 160. For example, the permanent magnets 160 may be arranged in alternating polarity. Additionally or alternatively, permanent magnets 160 may be attached to back plates 158, which may be attached to the linear permanent magnet carrier 150. Additionally or alternatively, stator 110 may include stator coil(s) (e.g., included and/or embedded within stator 110). For example, stator coils may include one or more coils of conductive material (e.g., electrical wiring and/or the like), which may induce a magnetic field when electrical current runs through such stator coils. In some non-limiting embodiments, stator 110 may include at least one port 120. For example, port 120 may provide access for electrical connection/coupling (e.g., by wiring, suitable electronics, and/or the like) to stator coils, access for electrical connection/coupling to optical sensor(s) 112a, 112b (e.g., by wiring, suitable electronics, and/or the like), and/or the like.

In some non-limiting embodiments, linear permanent magnet carrier 150 may be separated from stator 110 by air gap 162. Additionally or alternatively, target 152 and optical sensor(s) 112a, 112b may face air gap 162. In some non-limiting embodiments, linear permanent magnet carrier 150 may define first recess 114 to at least partially receive optical sensor(s) 112a, 112b. Additionally or alternatively, linear permanent magnet carrier 150 may define second recess 156 to at least partially receive target 152. In some non-limiting embodiments, optical sensor(s) 112a, 112b and target 152 do not entirely protrude into air gap 162 when received in first recess 114 and second recess 156, respectively. For example, optical sensor(s) 112a, 112b may partially protrude into air gap 162 (e.g., partially received in first recess 114) or may not protrude into air gap 162 at all (e.g., completely contained in first recess 114). Additionally or alternatively, target 152 may partially protrude into air gap 162 (e.g., partially received in second recess 156) or may not protrude into air gap 162 at all (e.g., completely contained in second recess 156). In some non-limiting limiting embodiments, stator 110 may include a receptacle 116 for optical sensor(s) 112a, 112b. For example, receptacle 116 may be at least partially received in first recess 114. Additionally or alternatively, receptacle 116 may by secured to stator 110 by any suitable number of fastener(s) 118 (e.g., one fastener 118, two fasteners 118, four fastener(s) 118, and/or the like). In some non-limiting embodiments, fastener(s) 118 may be any suitable fastener, including but not limited to, one or more bolts, nuts, screws, nails, clips, and/or the like.

In some non-limiting embodiments, stator 110 may include one or more optical sensors 112a, 112b. For example, stator 110 may include two optical sensors 112a, 112b, four optical sensors, and/or the like. In some non-limiting embodiments, stator 110 may include first optical sensor 112a and second optical sensor 112b. Additionally or alternatively, target 152 may include first pattern 154a and second pattern 154b. For example, first pattern 154a may be positioned to overlap with the optical path of the first optical sensor 112a (e.g., as linear permanent magnet carrier 150 moves relative to stator 110), and second pattern 154b may be positioned to overlap with the optical path of second optical sensor 112b (e.g., as linear permanent magnet carrier 150 moves relative to stator 110). Additionally or alternatively, first optical sensor 112a may produce a first output signal in response to sensing first pattern 154a and second optical sensor 112b may produce a second output signal in response to sensing second pattern 154b. Additionally or alternatively, first pattern 154a may be offset from second pattern 154b (e.g., in a direction of motion of linear permanent magnet carrier 150 relative to stator 110, which, as depicted in FIG. 1A, may be horizontal).

In some non-limiting embodiments, target 152 may include a mask comprising one of the colors (e.g., the second color). Additionally or alternatively, the mask may be affixed on at least a portion of linear permanent magnet carrier 150. In some non-limiting embodiments, the mask may define a plurality of holes corresponding to the first areas 155a. Additionally or alternatively, the portion of linear permanent magnet carrier 150 upon which the mask is affixed may include the other color (e.g., first color). Thus, the mask may include the second areas 155b and the holes in the mask may include the first areas 155a. In some non-limiting embodiments, the mask may be a dark color (e.g., black) and the portion of linear permanent magnet carrier 150 behind the holes may be a lighter color (e.g., white), or vice-versa.

In some non-limiting embodiments, optical sensor(s) 112a, 112b may include light emitting sensor(s). For example, at least some of the light emitting sensor(s) may include a laser and an optical receiver. The optical receiver may be integrated with or separate from the laser. In some non-limiting embodiments, light from the laser may reflect from target 152 (e.g., the portion of pattern 154a or 154b that overlaps with the optical path of the laser) and be received by the optical receiver. Additionally or alternatively, at least some of the light emitting sensor(s) may include a fiber optic transmitter and a fiber optic receiver. The fiber optic receiver may be integrated with or separate from the fiber optic transmitter. For example, the fiber optic transmitter may include a first optical fiber coupled to a light emitting diode (LED). Additionally or alternatively, the fiber optic receiver may include a second optical fiber coupled to an optical receiver. In some non-limiting embodiments, the first and second optical fibers may be separate cores of a multi-core fiber optic cable. Additionally or alternatively, the first and second optical fibers may be separate optical fibers of a duplex fiber optic cable. Additionally or alternatively, the first and second optical fibers may be coaxial. In some non-limiting embodiments, light from the fiber optic transmitter may reflect from target 152 (e.g., the portion of pattern 154a or 154b that overlaps with the optical path of the light from the fiber optic transmitter) and be received by the fiber optic receiver (e.g., be directed to the optical received by the second optical fiber).

In some non-limiting embodiments, the optical receiver(s) may generate an output signal (e.g., electrical signal such as voltage, current, and/or the like) in response to the reflected light. For example, the electrical signal may be correlated with and/or proportional to the amount of light received at the optical receiver. Additionally or alternatively, the output signal may be binary, e.g., high and/or on if the amount of light received at the optical receiver is above a threshold or low and/or off if the amount of light is below the threshold. In some non-limiting embodiments, the optical receiver of first optical sensor 112a may produce a first output signal in response to sensing first pattern 154a, and the optical receiver of second optical sensor 112b may produce a second output signal in response to sensing second pattern 154b.

In some non-limiting embodiments, at least one amplifier may be coupled to the optical sensor(s) 112a, 112b. For example, at least some amplifier(s) may be integrated with a respective one of the optical sensor(s) 112a, 112b. Additionally or alternatively, at least some amplifier(s) may be separate from optical sensor(s) 112a, 112b. For example, such amplifier may be separately disposed with stator 110 or be outside of stator 110 (e.g., electrically connected to optical sensor(s) 112a, 112b via port 120). In some non-limiting embodiments, each amplifier may amplify an output signal of a respective one of optical sensor(s) 112a, 112b. For example, the amplifier may amplify the output signal to be from 5V to 24V.

In some non-limiting embodiments, system 100 may include a controller (e.g., any suitable controller, such as controller 600 discussed below). For example, the controller may be coupled to optical sensor(s) 112a, 112b directly or indirectly (e.g., via amplifier(s), as discussed herein). In some non-limiting embodiments, the controller may receive the output signal of each optical sensor (e.g., as amplified by the amplifier(s), if any). Additionally or alternatively, the controller may determine a position, velocity, and/or the like of linear permanent magnet carrier 150 relative to stator 110 based on the output signal(s). For example, if a number of first areas 155a and/or second areas 155b in the pattern(s) 154a, 154b are known (e.g., selected, predetermined, and/or the like), and/or if the widths of first areas 155a and/or second areas 155b are known (e.g., selected, predetermined, and/or the like), measuring (e.g., counting) the number of first areas 155a and/or second areas 155b may allow determination of the length of the target (e.g., length of the linear permanent magnet carrier 150) has passed the optical sensor. Additionally or alternatively, if a first pattern 154a is offset from a second pattern 154*b* by a known amount (e.g., selected, predetermined, and/or the like), measuring the phase difference between the output signal of first optical sensor 112*a* and second optical sensor 112*b* may allow determination of the direction that target 152 (and linear permanent magnet carrier 150) is moving. Additionally or alternatively, if the widths of first areas 155*a* and/or second areas 155*b* are known (e.g., selected, predetermined, and/or the like), measuring the frequency of first areas 155*a* and/or second areas 155*b* (e.g., the number counted per unit of time) may allow determination of the speed that target 152 (and linear permanent magnet carrier 150) is moving. Additionally or alternatively, if position is determined (e.g., as described herein), the speed and/or velocity of target 152 (and linear permanent magnet carrier 150) may be determined based on the change in position over time (e.g., differential of position with respect to time). Additionally or alternatively, if the speed and/or velocity are determined (e.g., as described herein), the acceleration of target 152 (and linear permanent magnet carrier 150) may be determined based on the change in speed/velocity over time (e.g., differential of velocity with respect to time).

In some non-limiting embodiments, the controller may control the linear motor based on the determined position, velocity, and/or the like. For example, to move the linear permanent magnet carrier 150 (e.g., and a conveyance attached to such linear permanent magnet carrier 150) into a desired position, the controller may supply current to stator coils based on the position, velocity, and/or the like. Additionally or alternatively, the controller may increase, decrease, or stop supplying current to stator coils, change the timing that current is supplied to stator coils, and/or the like based on the position, velocity, and/or the like. Additionally or alternatively, the controller may open, close, or shunt at least a portion of a circuit interconnecting the stator coils based on the position, velocity, and/or the like.

Figure 2B:
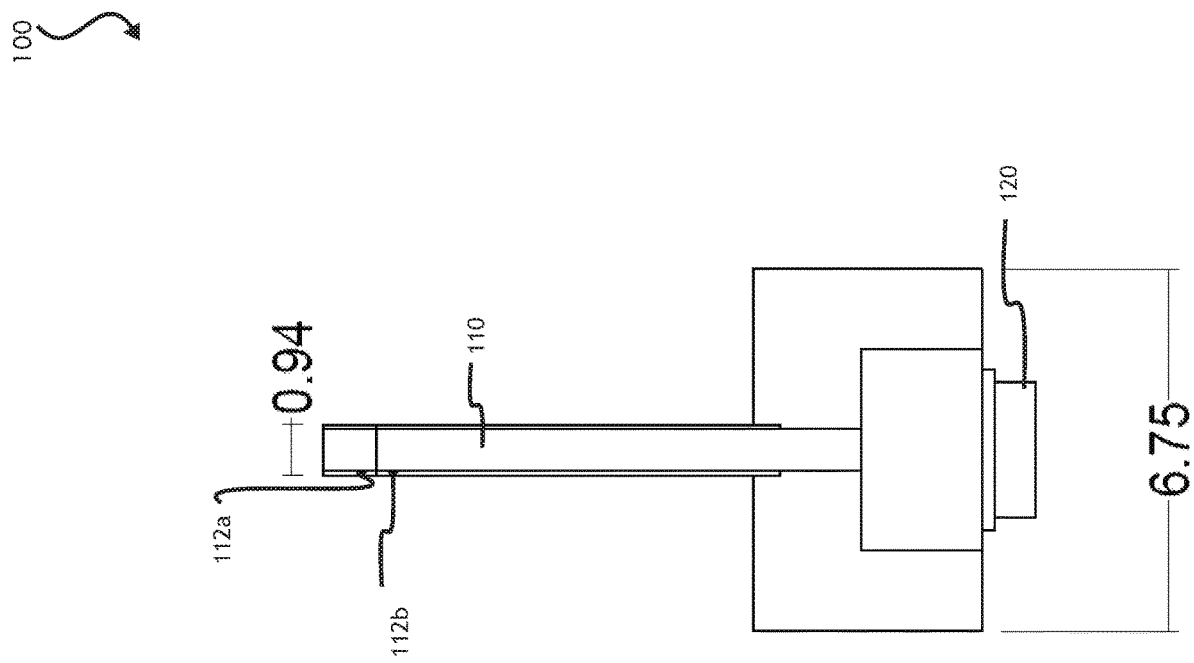
FIG. 2B is a diagram of a front view of a non-limiting embodiment of a portion of the system of FIG. 1A according to the principles of the presently disclosed subject matter.

Referring to FIGS. 2A-2B, relative dimensions of stator 110 are depicted. As shown in FIG. 2A, an upper portion of stator 110 (e.g., a portion that may be at least partially overlapped by linear permanent magnet carrier 150) may have a height of 8.00 inches, and a lower portion of stator 110 (e.g., a portion that may not be overlapped by linear permanent magnet carrier 150) may have a height of 4.25 inches. Additionally or alternatively, stator 110 may have a length of 44.75 inches. Additionally or alternatively, receptacle 116 (and corresponding first recess 114) may have a height of 1.77 inches and a length of 2.64 inches. As shown in FIG. 2B, the upper portion of stator 110 may have a width of 0.94 inches. Additionally or alternatively, the lower portion of stator 110 may have a width of 6.75 inches. In some non-limiting embodiments, the upper portion of stator 110 may be narrower (e.g., have less width) than the lower portion of stator 110 (e.g., to accommodate partial overlap of the linear permanent magnet carrier 150 with the upper portion of stator 110, and/or to accommodate ports 120, electrical connections, and/or the like in the lower portion of stator 110).

The number and arrangement of systems, devices, and/or components shown in FIGS. 1A-2B are provided as an example. There may be additional systems, devices, and/or components; fewer systems, devices, and/or components; different systems, devices, and/or components; and/or differently arranged systems, devices, and/or components than those shown in FIGS. 1A-2B. Furthermore, two or more devices or components shown in FIGS. 1A-2B may be implemented within a single device or component, or a single device or component shown in FIGS. 1A-2B may be implemented as multiple, distributed device or components. Additionally or alternatively, a set of devices (e.g., one or more devices) or a set of components (e.g., one or more components) of system 100 may perform one or more functions described as being performed by another set of devices or another set of components of system 100.

Figure 3A:
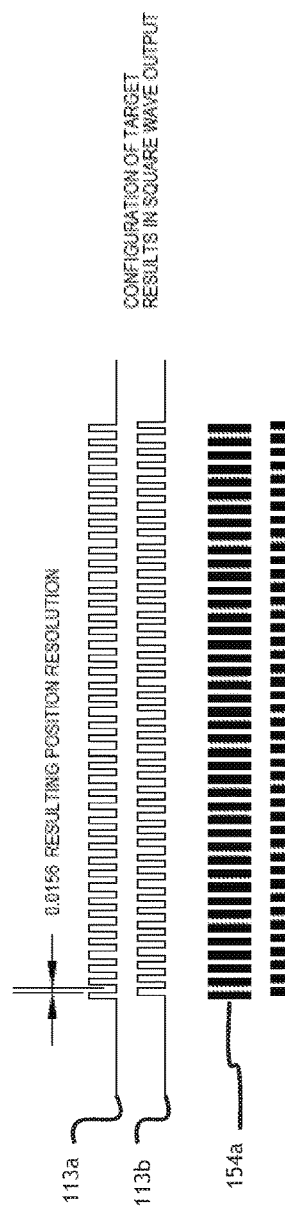
FIG. 3A is a diagram of an exemplary target and corresponding waveforms of output signals of a non-limiting embodiment of a system for optical sensing according to the principles of the presently disclosed subject matter.
Figure 3B:
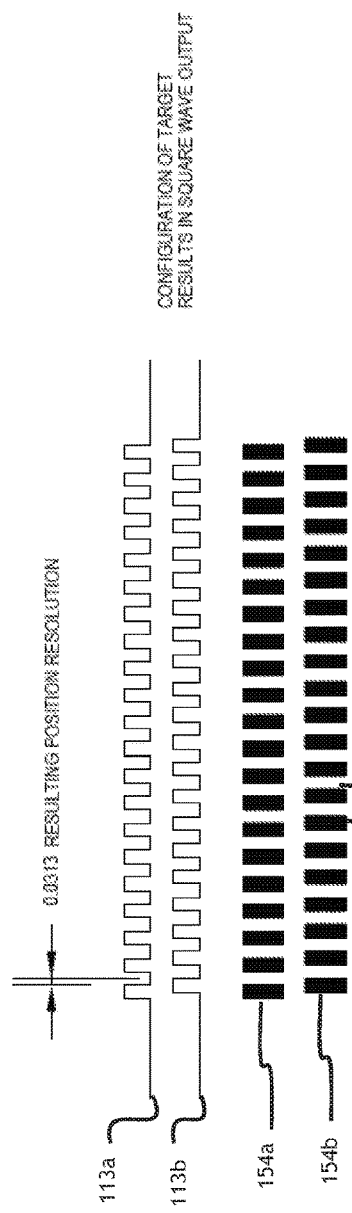
FIG. 3B is a diagram of an exemplary target and corresponding waveforms of output signals of a non-limiting embodiment of a system for optical sensing according to the principles of the presently disclosed subject matter.
Figure 3C:
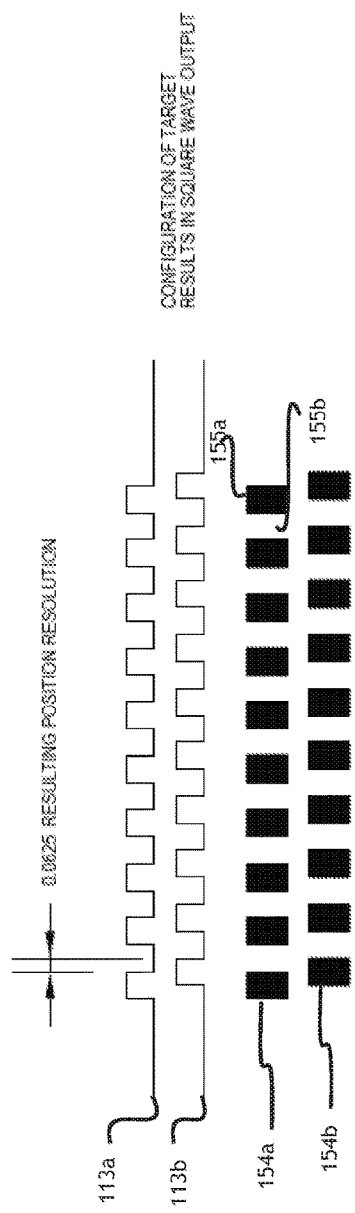
FIG. 3C is a diagram of an exemplary target and corresponding waveforms of output signals of a non-limiting embodiment of a system for optical sensing according to the principles of the presently disclosed subject matter.

Referring now to FIGS. 3A-3C, FIGS. 3A-3C are diagrams of non-limiting embodiments of exemplary patterns 154*a*, 154*b* of target 152 and corresponding output signals 113*a*, 113*b*. In some embodiments, as shown in FIG. 3A, patterns 154*a*, 154*b* have alternating first areas 155*a* of a first color (e.g., black) and second areas 155*b* of a second color (e.g., white). The first areas 155*a* and second areas 155*b* may be relatively narrow (e.g., compared to FIGS. 3B-3C). Additionally, second pattern 154*b* may be horizontally offset from first pattern 154*a*. In response to sensing first pattern 154*a* and second pattern 154*b*, first output signal 113*a* and second output signal 113*b* may be generated, respectively, as described herein. For example, the smallest resolution of the position that may be sensed based on the output signals may be determined based on the difference in time between sensing an edge of first output signal 113*a* and a corresponding edge in second output signal 113*b*. Such difference may be associated with (e.g., correlated with) the horizontal offset between first pattern 154*a* and second pattern 154*b*. Since the first areas 155*a* and second areas 155*b* are relatively narrow, the resolution may be relatively small, e.g., less than 0.02 inches, less than 0.0156 inches, and/or the like.

In some embodiments, as shown in FIG. 3B, patterns 154*a*, 154*b* have alternating first areas 155*a* of a first color (e.g., black) and second areas 155*b* of a second color (e.g., white). The first areas 155*a* and second areas 155*b* may be relatively wider than FIG. 3A. Additionally, second pattern 154*b* may be horizontally offset from first pattern 154*a*. In response to sensing first pattern 154*a* and second pattern 154*b*, first output signal 113*a* and second output signal 113*b* may be generated, respectively, as described herein. For example, the smallest resolution of the position that may be sensed based on the output signals may be the determined based on the difference in time between sensing an edge of first output signal 113*a* and a corresponding edge in second output signal 113*b*. Such difference may be associated with (e.g., correlated with) the horizontal offset between first pattern 154*a* and second pattern 154*b*. Since first areas 155*a* and second areas 155*b* are relatively wider than FIG. 3A, the resolution may be relatively larger, e.g., less than 0.04 inches, less than 0.0313 inches, and/or the like.

In some embodiments, as shown in FIG. 3C, patterns 154*a*, 154*b* have alternating first areas 155*a* of a first color (e.g., black) and second areas 155*b* of a second color (e.g., white). The first areas 155*a* and second areas 155*b* may be relatively wider than FIGS. 3A-3B. Additionally, second pattern 154*b* may be horizontally offset from first pattern 154*a*. In response to sensing first pattern 154*a* and second pattern 154*b*, first output signal 113*a* and second output signal 113*b* may be generated, respectively, as described herein. For example, the smallest resolution of the position that may be sensed based on the output signals may be the determined based on the difference in time between sensing an edge of first output signal 113*a* and a corresponding edge in second output signal 113*b*. Such difference may be associated with (e.g., correlated with) the horizontal offset between first pattern 154*a* and second pattern 154*b*. Since first areas 155*a* and second areas 155*b* are relatively wider than FIGS. 3A-3B, the resolution may be relatively larger, e.g., less than 0.07 inches, less than 0.0625 inches, and/or the like.

While smaller resolution may allow for more precise determination of position, it may be challenging to determine position at smaller resolutions as speed increases (e.g., limited by the sensing speed of optical sensor(s) 112a, 112b and/or limited by the processing speed of the controller(s)). For example, for applications with relatively higher speeds, it may be desirable to use (e.g., select, predetermine, and/or the like) relatively larger patterns 154a, 154b corresponding to relatively larger resolutions. Additionally or alternatively, for applications with relatively lower speeds and/or relatively greater need for precision in determination of position, it may be desirable to use (e.g., select, predetermine, and/or the like) relatively smaller patterns 154a, 154b corresponding to relatively smaller resolutions.

In some non-limiting embodiments, the pattern(s) 154a, 154b of first areas 155a and second areas 155b may be uniform, such that the width and/or spacing of the first areas 155a may be the same along the entire length of the pattern(s) 154a, 154b and the width and/or spacing of the second areas 155b may be the same along the entire length of the pattern(s) 154a, 154b. In some non-limiting embodiments, the pattern(s) 154a, 154b may have areas of different width and/or spacing of first areas 155a and second areas 155b. For example, pattern(s) 154a, 154b may have a first portion of relatively larger width and/or spacing of first areas 155a and/or second areas 155b, a second portion with relatively narrower width and/or spacing of the first areas 155a and/or second areas 155b than the first portion, and a third portion with relatively narrower width and/or spacing of first areas 155a and/or second areas 155b than the second portion. Such pattern(s) 154a, 154b may accommodate higher speeds but lower resolution in the first portion, relatively lower speeds but relatively higher resolution in the second portion, and a relatively lowest speed but relatively highest resolution in the third portion. In some non-limiting embodiments, the pattern(s) 154a, 154b may be a gradient such that the width and/or spacing of first areas 155a and/or second areas 155b gradually increase or decrease along the length of the pattern(s) 154a, 154b.

Figure 4:
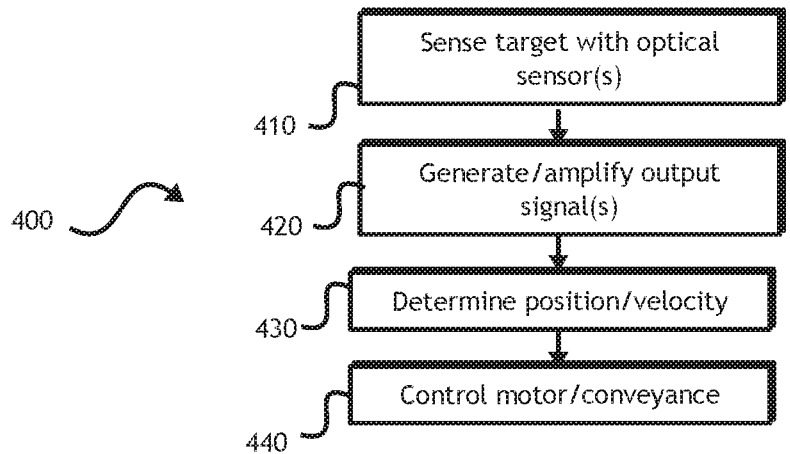
FIG. 4 is a flowchart of a non-limiting embodiment of a process for optical sensing according to the principles of the presently disclosed subject matter.

Referring now to FIG. 4, FIG. 4 is a flowchart of a non-limiting embodiment of a process 400 for optical sensing. In some non-limiting embodiments, one or more of the steps of process 400 may be performed (e.g., completely, partially, and/or the like) by system 100 (e.g., one or more devices or components of system 100). In some non-limiting embodiments, one or more of the steps of process 400 may be performed (e.g., completely, partially, and/or the like) by controller 600 (e.g., one or more devices or components of controller 600). In some non-limiting embodiments, one or more of the steps of process 400 may be performed (e.g., completely, partially, and/or the like) by another system, another device, another component, another group of systems, another group of devices, or another group of components separate from or including system 100 and/or controller 600.

As shown in FIG. 4, at step 410, process 400 may include sensing target (e.g., with optical sensors). For example, optical sensor(s) 112a, 112b may sense target 152 as described herein. In some non-limiting embodiments, optical sensor(s) 112a, 112b may be disposed with a first member (e.g., stator 110 or linear permanent magnet carrier 150) of a linear motor (e.g., linear synchronous motor, linear induction motor, and/or the like), as described herein. Additionally or alternatively, target 152 may be disposed with a second member (e.g., linear permanent magnet carrier 150 or stator 110, respectively) of the linear motor (e.g., linear synchronous motor, linear induction motor, and/or the like), as described herein. The second member (e.g., linear permanent magnet carrier 150 or stator 110) may be movable relative to the first member (e.g., stator 110 or linear permanent magnet carrier 150, respectively), as described herein. In some non-limiting embodiments, target 152 may include at least one pattern 154a, 154b of alternating first areas 155a and second areas 155b. First areas 155a may include a first color, and second areas 155b may include a second color different than first areas 155a, as described herein. Additionally or alternatively, target 152 may be positioned to overlap with an optical path of optical sensor(s) 112a, 112b as the second member (e.g., linear permanent magnet carrier 150 or stator 110) moves relative to the first member (e.g., stator 110 or linear permanent magnet carrier 150, respectively), as described herein.

As shown in FIG. 4, at step 420, process 400 may include generating and/or amplifying output signals. For example, each optical sensor 112a, 112b may generate an output signal based on sensing target 152, as described herein. Additionally or alternatively, an amplifier may amplify the output signal of each optical sensor 112a, 112b, as described herein.

As shown in FIG. 4, at step 430, process 400 may include determining position, velocity, and/or the like. For example, a controller (e.g., controller 600) may be coupled to optical sensor(s) 112a, 112b (e.g., directly or via amplifier(s)), as described herein. Additionally or alternatively, the controller (e.g., controller 600) may determine position, velocity, and/or the like of the second member (e.g., linear permanent magnet carrier 150 or stator 110) relative to the first member (e.g., stator 110 or linear permanent magnet carrier 150, respectively) based on the output signal of each optical sensor 112a, 112b, as described herein.

As shown in FIG. 4, at step 440, process 400 may include controlling the motor and/or conveyance. For example, a controller (e.g., controller 600) may control the motor (e.g., linear synchronous motor, linear induction motor, and/or the like) or conveyance (e.g., attached to at least one member of the motor) based on the sensed/determined position, velocity, and/or the like, as described herein.

Figure 5:
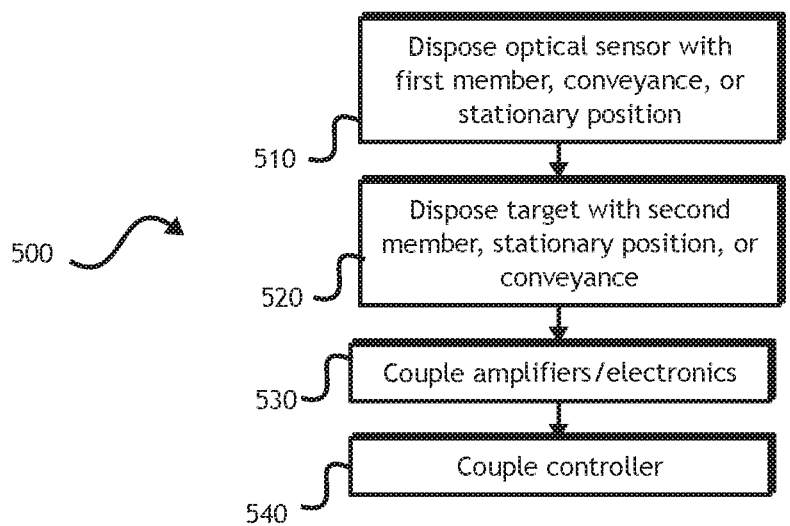
FIG. 5 is a flowchart of a non-limiting embodiment of a process for making a system for optical sensing according to the principles of the presently disclosed subject matter.

Referring now to FIG. 5, FIG. 5 is a flowchart of a non-limiting embodiment of a process 500 for making a system for optical sensing. As shown in FIG. 5, at step 510, process 500 may include disposing/positioning at least one optical sensor. For example, optical sensors 112a, 112b may be disposed, positioned, affixed, and/or the like (e.g., by fastener(s) 118, welding, adhesive, and/or the like) with a first member of a linear motor (e.g., stator 110 or linear permanent magnet carrier 150), a conveyance (e.g., attached to at least one member of linear motor), or a stationary position (e.g., a wall, an object, and/or the like), as described herein.

In some non-limiting embodiments, the system may be a linear motor (e.g., linear synchronous motor, linear induction motor, and/or the like), optical sensor(s) 112a, 112b may be attached to a first member (e.g., stator 110 or linear permanent magnet carrier 150) of the linear motor, and target 152 may be attached to a second member (e.g., linear permanent magnet carrier 150 or stator 110, respectively), as described herein. In some non-limiting embodiments, the second member (e.g., linear permanent magnet carrier 150 or stator 110) may be separated from the first member (e.g., stator 110 or linear permanent magnet carrier 150, respectively) by air gap 162, as described herein. Additionally or alternatively, target 152 and optical sensor(s) 112*a*, 112*b* may face the air gap, as described herein.

In some non-limiting embodiments, first recess 114 may be formed (e.g., by cutting, drilling, milling, lathing, and/or the like) in the first member (e.g., stator 110 or linear permanent magnet carrier 150) to at least partially receive optical sensor(s) 112*a*, 112*b*, as described herein. In some non-limiting embodiments, optical sensor(s) 112*a*, 112*b* do not entirely protrude into air gap 162 when received in first recess 114, as described herein.

In some non-limiting embodiments, optical sensor(s) 112*a*, 112*b* may include first optical sensor 112*a* and second optical sensor 112*b*.

As shown in FIG. 5, at step 520, process 500 may include disposing/positioning at least one target. For example, target 152 may be disposed, positioned, affixed, and/or the like (e.g., by fastener(s) 118, welding, adhesive, and/or the like) with a second member of a linear motor (e.g., linear permanent magnet carrier 150 or stator 110, respectively), a conveyance (e.g., attached to at least one member of a linear motor), or a stationary position (e.g., a wall, an object, and/or the like), as described herein. In some non-limiting embodiments, target 152 (or the item with which such target 152 is disposed, positioned, affixed, and/or the like) may be movable relative to optical sensor(s) 112*a*, 112*b* (or the item with which such optical sensor(s) 112*a*, 112*b* is/are disposed, positioned, affixed, and/or the like), as described herein. In some non-limiting embodiments, target 152 may include at least one pattern 154*a*, 154*b* of alternating first areas 155*a* and second areas 155*b*, as described herein. Additionally or alternatively, first areas 155*a* may include a first color, and second areas 155*b* may include a second color different than first areas 155*a*, as described herein. In some non-limiting embodiments, target 152 may be positioned to overlap with an optical path of optical sensor(s) 112*a*, 112*b* as target 152 moves relative to optical sensor(s) 112*a*, 112*b*, as described herein.

In some non-limiting embodiments, second recess 156 may be formed (e.g., by cutting, drilling, milling, lathing, and/or the like) in the second member (e.g., linear permanent magnet carrier 150 or stator 110, respectively) to at least partially receive target 152, as described herein. In some non-limiting embodiments, target 152 does not entirely protrude into air gap 162 when received in second recess 156, as described herein.

In some non-limiting embodiments, target 152 may include first pattern 154*a* and second pattern 154*b*, as described herein. For example, first pattern 154*a* may be positioned to overlap with the optical path of first optical sensor 112*a*, as described herein. Additionally or alternatively, second pattern 155*b* may be positioned to overlap with the optical path of second optical sensor 112*b*, as described herein. In some non-limiting embodiments, first pattern 154*a* may be offset from second pattern 154*b* in a direction of motion of target 152 (e.g., horizontal), as described herein.

In some non-limiting embodiments, making target 152 may include forming a mask (e.g., of the second color), as described herein. A plurality of holes may be defined (e.g., by cutting, drilling, milling, lathing, and/or the like) in the mask corresponding to first areas 155*a*, as described herein. A portion of the second member (e.g., linear permanent magnet carrier 150, stator 110, a conveyance attached to at least one member of a linear motor, and/or the like) may include the first color (e.g., by natural coloring, paint, and/or the like), as described herein. The mask may be affixed (e.g., by fastener(s) 118, welding, adhesive, and/or the like) on that portion of the second member, as described herein.

As shown in FIG. 5, at step 530, process 500 may include connecting electronics (e.g., amplifiers, electrical connections/wiring, and/or the like). For example, an amplifier may be connected to each optical sensor 112*a*, 112*b*, as described herein. Additionally or alternatively, each optical sensor 112*a*, 112*b* may be electrically coupled (e.g., directly or via amplifier(s)) to electrical wiring (e.g., which may run through port(s) 120 to a controller, such as controller 600).

As shown in FIG. 5, at step 540, process 500 may include coupling a controller. For example, the controller (e.g., controller 600) may be connected to each optical sensor 112*a*, 112*b* (e.g., directly or via amplifier(s)), as described herein.

Figure 6:
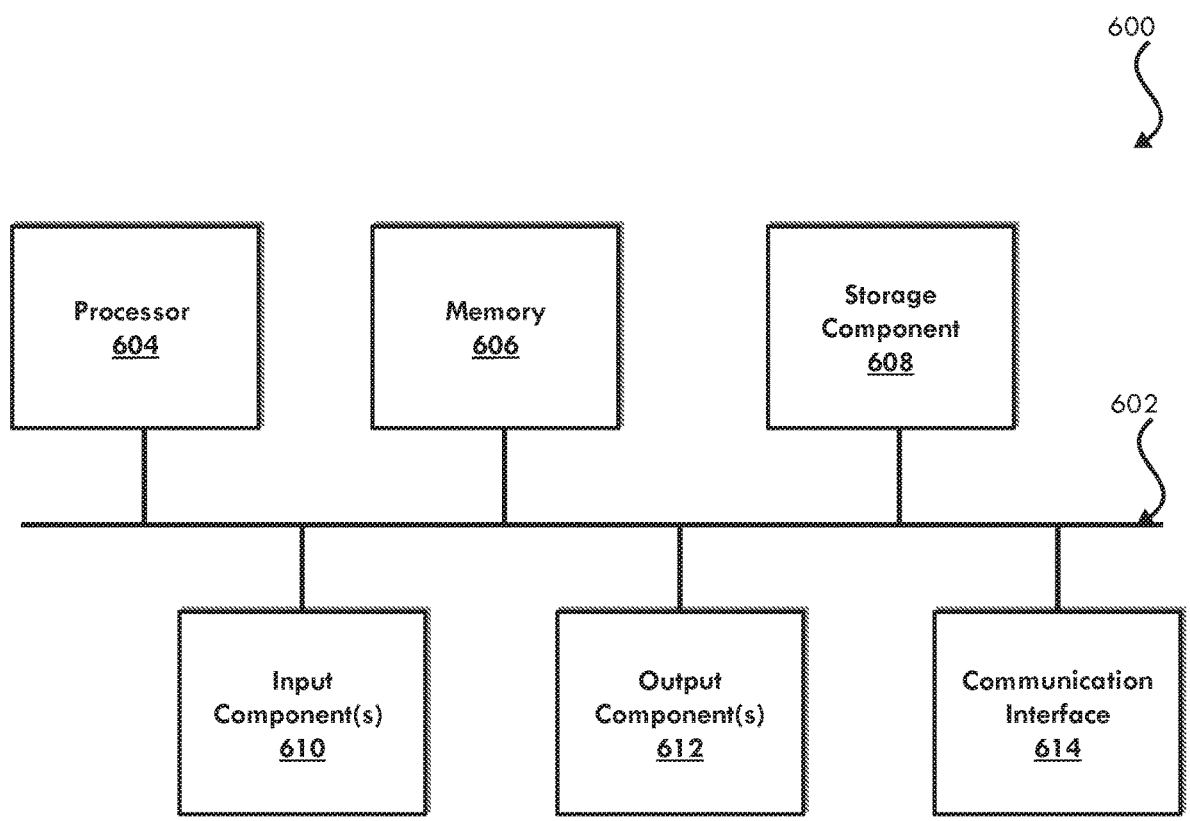
FIG. 6 is a diagram of a non-limiting embodiment of components of one or more controllers for a system for optical sensing according to the principles of the presently disclosed subject matter.

Referring now to FIG. 6, FIG. 6 is a diagram of example components of a controller 600. Controller 600 may correspond to one or more controllers of system 100. In some non-limiting embodiments, system 100 may include at least one controller 600 and/or at least one component of controller 600. As shown in FIG. 6, controller 600 may include bus 602, processor 604, memory 606, storage component 608, input component 610, output component 612, and communication interface 614.

Bus 602 may include a component that permits communication among the components of device 600. In some non-limiting embodiments, processor 604 may be implemented in hardware, firmware, or a combination of hardware and software. For example, processor 604 may include a processor (e.g., a central processing unit (CPU), a graphics processing unit (GPU), an accelerated processing unit (APU), and/or the like), a microprocessor, a digital signal processor (DSP), a programmable logic controller (PLC), and/or any processing component (e.g., a field-programmable gate array (FPGA), an application-specific integrated circuit (ASIC), and/or the like), and/or the like, which can be programmed to perform a function. Memory 606 may include random access memory (RAM), read only memory (ROM), and/or another type of dynamic or static storage device (e.g., flash memory, magnetic memory, optical memory, and/or the like) that stores information and/or instructions for use by processor 604.

Storage component 608 may store information and/or software related to the operation and use of controller 600. For example, storage component 608 may include a hard disk (e.g., a magnetic disk, an optical disk, a magneto-optic disk, a solid state disk, and/or the like), a compact disc (CD), a digital versatile disc (DVD), a floppy disk, a cartridge, a magnetic tape, and/or another type of computer-readable medium, along with a corresponding drive.

Input component 610 may include a component that permits controller 600 to receive information, such as via user input (e.g., a touch screen display, a keyboard, a keypad, a mouse, a button, a switch, a microphone, a camera, and/or the like). Additionally or alternatively, input component 610 may include a sensor for sensing information (e.g., a global positioning system (GPS) component, an accelerometer, a gyroscope, an actuator, and/or the like) an electrical connection/coupling to a sensor (e.g., optical sensor(s) 112*a*, 112*b*, directly or via amplifier(s), as described herein), and/or the like. Output component 612 may include a component that provides output information from controller 600 (e.g., a display, a speaker, one or more light-emitting diodes (LEDs), and/or the like).

Communication interface 614 may include a transceiver-like component (e.g., a transceiver, a receiver and transmitter that are separate, and/or the like) that enables device 600 to communicate with other devices, such as via a wired connection, a wireless connection, or a combination of wired and wireless connections. Communication interface 614 may permit controller 600 to receive information from another device and/or provide information to another device. For example, communication interface 614 may include an Ethernet interface, an optical interface, a coaxial interface, an infrared interface, a radio frequency (RF) interface, a universal serial bus (USB) interface, a Wi-Fi® interface, a Bluetooth® interface, a Zigbee® interface, a cellular network interface, and/or the like.

Controller 600 may perform one or more processes described herein. Controller 600 may perform these processes based on processor 604 executing software instructions stored by a computer-readable medium, such as memory 606 and/or storage component 608. A computer-readable medium (e.g., a non-transitory computer-readable medium) is defined herein as a non-transitory memory device. A non-transitory memory device includes memory space located inside of a single physical storage device or memory space spread across multiple physical storage devices.

Software instructions may be read into memory 606 and/or storage component 608 from another computer-readable medium or from another device via communication interface 614. When executed, software instructions stored in memory 606 and/or storage component 608 may cause processor 604 to perform one or more processes described herein. Additionally or alternatively, hardwired circuitry may be used in place of or in combination with software instructions to perform one or more processes described herein. Thus, embodiments described herein are not limited to any specific combination of hardware circuitry and software.

The number and arrangement of components shown in FIG. 6 are provided as an example. In some non-limiting embodiments, controller 600 may include additional components, fewer components, different components, or differently arranged components than those shown in FIG. 6. Additionally or alternatively, a set of components (e.g., one or more components) of controller 600 may perform one or more functions described as being performed by another set of components of controller 600.

Non-limiting embodiments of the disclosed subject matter may use optical components (e.g., sensors), which may include, but are not limited to, fiber optic transmitters and receivers. In some non-limiting embodiments, the disclosed subject matter may be useful to determine the position of a conveyance as it moves on a track. In some non-limiting embodiments, the disclosed subject matter may be useful for a conveyance that may not be confined to a track, e.g., that may be locationally controlled within a confined space, such as a hallway or a warehouse. In some non-limiting embodiments, sensing may occur without any attached cables, which may be advantageous. For example, attached cables may restrict motion of the vehicle. In some non-limiting embodiments, the resolution of the system may be variable, e.g., may depend on the design of the target (which may be mounted on a conveyance) and/or the number and style of optical components (e.g., sensors), which may be mounted on a fixed/stationary surface (e.g., the conveyance may be movable relative to the fixed/stationary surface). For example, in some non-limiting embodiments, the disclosed subject matter may be useful in the amusement, industrial/manufacturing, and/or automation industries.

In some non-limiting embodiments, no physical connection (e.g., such as from wires) may be used between a conveyance and sensors/monitoring electronics, which may allow for improved mobility of the conveyance, improved control, and/or extended distance between a control station (e.g., controller) and the conveyance. For example, in some non-limiting embodiments, travel distance of the conveyance may be virtually unlimited while still allowing for monitoring and control of the conveyance's position.

In some non-limiting embodiments, a conveyance may enter a zone where positioning of the conveyance may be controlled by systems (e.g., controllers, linear motors, and/or the like), as described herein. Additionally or alternatively, sensing position/location of the conveyance may be untethered by cables or other electronics/equipment. In some non-limiting embodiments, a vehicle may be monitored by optical sensors, e.g., as described herein, at all times.

In some non-limiting embodiments, a system may include optical components (e.g., sensors), which may include optical transmitters and/or optical receivers. Additionally or alternatively, the optical sensors may reflect light off of a target. In some non-limiting embodiments, optical sensors (e.g., transmitters and/or receivers) may be mounted at a stationary position (e.g., on a track or a portion thereof, on a wall, on an object, and/or the like). Additionally or alternatively, the target may be mounted on a vehicle. As such, physical contact between the optical components (e.g., sensors) and the conveyance may be unnecessary. In some non-limiting embodiments (e.g., without a track), the optical components (e.g., one or more optical transmitters, such as one or more lasers) may be mounted (e.g., on the conveyance) so that they are capable of making an optical connection with a sensor (e.g., optical receiver), which may be attached to a stationary position.

In some non-limiting embodiments, a quadrature encoder may be used. For example, the quadrature encoder may be configured so that two signals (e.g., signal A from a first optical sensor and signal B from a second optical sensor) may be generated by the positioning of optic sensors (e.g., transmitters and/or receivers) and a target. In some non-limiting embodiments, accuracy and resolution may be determined based on the width and/or spacing of patterns on the target (e.g., a first pattern A and/or a second pattern B), the optic sensors, the size and/or length of a target's patterns (e.g., the length of a pattern may correspond to total ON/OFF times for signals sensed from such target), and/or the like. In some non-limiting embodiments, signal A and signal B may be processed by specialized and non-generic electronics (e.g., a controller, such as a programmable logic controller) to determine position, direction of motion, velocity, and/or the like. Additionally or alternatively, signal A and signal B may be processed into a continuous pulse stream that can allow pulse counting to position, velocity, and/or the like.

In some non-limiting embodiments, optical sensing, as described herein, may be used between the conveyance (e.g., a vehicle) and a track. Such a configuration may not require a physical or tethered connection between optical sensors and targets. Additionally or alternatively, such a configuration may produce superior and unexpected results of producing a system that may allow for greater range of movement of a conveyance (e.g., vehicle) while also tracking the position, velocity, and/or the like of said conveyance.

In some non-limiting embodiments, lasers may be used in place of (or in addition to) reflective optics. For example, depending upon size constraints, lasers may be mounted on a conveyance. Additionally or alternatively, such lasers may transmit light to sensors mounted at a stationary position (e.g., on a track or a portion thereof). Such an embodiment may be useful in applications where there is a relatively greater distance between a conveyance and the stationary position (e.g., a track or a portion thereof). In some non-limiting embodiments, a laser may include a power source within the conveyance to power the laser.

In some non-limiting embodiments, the disclosed subject matter may allow fine (e.g., high resolution) positioning without constant, direct contact of a moving conveyance to monitoring electronics.

Although the disclosed subject matter has been described in detail for the purpose of illustration based on what is currently considered to be the most practical and preferred embodiments, it is to be understood that such detail is solely for that purpose and that the disclosed subject matter is not limited to the disclosed embodiments, but, on the contrary, is intended to cover modifications and equivalent arrangements that are within the spirit and scope of the appended claims. For example, it is to be understood that the presently disclosed subject matter contemplates that, to the extent possible, one or more features of any embodiment can be combined with one or more features of any other embodiment.

What is claimed is:

1. A system for optical sensing, comprising:
    a linear motor comprising a stator and a linear permanent magnet carrier movable relative to the stator;
    at least one optical sensor disposed with the stator; and
    a target disposed with the linear permanent magnet carrier, the target comprising at least one pattern of alternating first areas and second areas, the first areas comprising a first color, the second areas comprising a second color different than the first areas, the target positioned to overlap with an optical path of the at least one optical sensor as the linear permanent magnet carrier moves relative to the stator.

2. The system of claim 1, wherein the stator is attached to at least a portion of a track, and wherein the linear permanent magnet carrier is attached to a conveyance.

3. The system of claim 1, wherein the linear permanent magnet carrier comprises at least two permanent magnets arranged in alternating polarity, and wherein the stator comprises stator coils.

4. The system of claim 1, wherein the linear permanent magnet carrier is separated from the stator by an air gap, wherein the target and the at least one optical sensor face the air gap, wherein the stator defines a first recess to at least partially receive the at least one optical sensor, wherein the linear permanent magnet carrier defines a second recess to at least partially receive the target, and wherein the at least one optical sensor and the target do not entirely protrude into the air gap when received in the first recess and the second recess, respectively.

5. The system of claim 1, wherein the at least one optical sensor comprises a first optical sensor and a second optical sensor, and wherein the at least one pattern comprises a first pattern and a second pattern, the first pattern positioned to overlap with the optical path of the first optical sensor as the linear permanent magnet carrier moves relative to the stator, and the second pattern positioned to overlap with the optical path of the second optical sensor as the linear permanent magnet carrier moves relative to the stator.

6. The system of claim 5, wherein the first pattern is offset from the second pattern in a direction of motion of the linear permanent magnet carrier relative to the stator.

7. The system of claim 1, wherein the target comprises a mask comprising the second color, the mask affixed on a portion of the linear permanent magnet carrier, the mask defining a plurality of holes corresponding to the first areas, wherein the portion of the linear permanent magnet carrier comprises the first color.

8. The system of claim 1, wherein the at least one optical sensor comprises at least one light emitting sensor.

9. The system of claim 8, wherein the at least one light emitting sensor comprises a laser and an optical receiver.

10. The system of claim 8, wherein the at least one light emitting sensor comprises a fiber optic transmitter and a fiber optic receiver.

11. The system of claim 10, wherein the fiber optic transmitter comprises a first optical fiber coupled to a light emitting diode (LED), and wherein the fiber optic receiver comprises a second optical fiber coupled to an optical receiver.

12. The system of claim 11, wherein the first optical fiber and the second optical fiber are coaxial.

13. The system of claim 1, further comprising at least one amplifier coupled to the at least one optical sensor, each amplifier configured to amplify an output signal of a respective one of the at least one optical sensor.

14. The system of claim 13, further comprising a controller coupled to the at least one amplifier, the controller configured to receive the output signal of each optical sensor as amplified by the at least one amplifier, the controller configured to determine at least one of a position or a velocity of the linear permanent magnet carrier relative to the stator based on the output signal of each optical sensor.

15. The system of claim 14, wherein the at least one optical sensor comprises a first optical sensor and a second optical sensor, wherein the at least one pattern comprises a first pattern and a second pattern, the first pattern positioned to overlap with the optical path of the first optical sensor as the linear permanent magnet carrier moves relative to the stator, and the second pattern positioned to overlap with the optical path of the second optical sensor as the linear permanent magnet carrier moves relative to the stator, wherein the first optical sensor produces a first output signal in response to sensing the first pattern of the target, wherein the second optical sensor produces a second output signal in response to sensing the second pattern of the target.

16. The system of claim 14, wherein the controller is further configured to control the linear motor based on the at least one of the position or velocity.

17. A method for optical sensing, comprising:
    sensing, with at least one optical sensor disposed with a stator of a linear motor, a target, the target disposed with a linear permanent magnet carrier of the linear motor, the linear permanent magnet carrier movable relative to the stator, the target comprising at least one pattern of alternating first areas and second areas, the first areas comprising a first color, the second areas comprising a second color different than the first areas, the target positioned to overlap with an optical path of the at least one optical sensor as the linear permanent magnet carrier moves relative to the stator;
    generating, with each optical sensor, an output signal based on sensing the target; and
    determining, with a controller coupled to the at least one optical sensor, at least one of a position or a velocity of the linear permanent magnet carrier relative to the stator based on the output signal of each optical sensor.

18. The method of claim 17, further comprising controlling the linear motor based on the at least one of the position or velocity.

19. A method of making a system for optical sensing, comprising:
- disposing at least one optical sensor with a stator of a linear motor; and
- disposing a target with a linear permanent magnet carrier of the linear motor, the linear permanent magnet carrier movable relative to the stator, the target comprising at least one pattern of alternating first areas and second areas, the first areas comprising a first color, the second areas comprising a second color different than the first areas, the target positioned to overlap with an optical path of the at least one optical sensor as the linear permanent magnet carrier moves relative to the stator.

20. The method of claim 19, wherein the linear permanent magnet carrier is separated from the stator by an air gap,
- wherein the target and the at least one optical sensor face the air gap,
- wherein disposing the at least one optical sensor with the stator comprises forming, in the stator of the linear motor, a first recess to at least partially receive the at least one optical sensor,
- wherein disposing the target with the linear permanent magnet carrier comprises forming, in the linear permanent magnet carrier of the linear motor, a second recess to at least partially receive the target, and
- wherein the at least one optical sensor and the target do not entirely protrude into the air gap when received in the first recess and second recess, respectively.

21. The method of claim 19, wherein the at least one optical sensor comprises a first optical sensor and a second optical sensor, wherein the at least one pattern comprises a first pattern and a second pattern, the first pattern positioned to overlap with the optical path of the first optical sensor as the linear permanent magnet carrier moves relative to the stator, and the second pattern positioned to overlap with the optical path of the second optical sensor as the linear permanent magnet carrier moves relative to the stator, and wherein the first pattern is offset from the second pattern in a direction of motion of the linear permanent magnet carrier relative to the stator.

22. The method of claim 19, wherein the target comprises a mask comprising the second color, the mask defining a plurality of holes corresponding to the first areas, wherein a portion of the linear permanent magnet carrier comprises the first color, and wherein disposing the target with the linear permanent magnet carrier comprises affixing the mask on the portion of the linear permanent magnet carrier.

23. The method of claim 19, further comprising:
- coupling at least one amplifier to the at least one optical sensor, each amplifier configured to amplify an output signal of a respective one of the least one optical sensor; and
- coupling a controller to the at least one amplifier, the controller configured to receive the output signal of each optical sensor as amplified by the at least one amplifier, the controller configured to determine at least one of a position or a velocity of the linear permanent magnet carrier relative to the stator based on the output signal of each optical sensor.

* * * * *

UNITED STATES PATENT AND TRADEMARK OFFICE
CERTIFICATE OF CORRECTION

PATENT NO. : 10,838,064 B2
APPLICATION NO. : 16/645021
DATED : November 17, 2020
INVENTOR(S) : Domenic P. Marzano Page 1 of 1

It is certified that error appears in the above-identified patent and that said Letters Patent is hereby corrected as shown below:

In the Claims

Column 24, Line 21, Claim 23, after "of the" insert -- at --

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*